(12) United States Patent
Blanchard et al.

(10) Patent No.: US 9,275,978 B2
(45) Date of Patent: *Mar. 1, 2016

(54) THREE-TERMINAL PRINTED DEVICES INTERCONNECTED AS CIRCUITS

(71) Applicant: Nthdegree Technologies Worldwide Inc., Tempe, AZ (US)

(72) Inventors: Richard Austin Blanchard, Los Altos, CA (US); Bradley S. Oraw, Chandler, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/789,454

(22) Filed: Jul. 1, 2015

(65) Prior Publication Data

US 2015/0303177 A1 Oct. 22, 2015

Related U.S. Application Data

(63) Continuation-in-part of application No. 14/204,886, filed on Mar. 11, 2014, now Pat. No. 9,099,568.

(60) Provisional application No. 61/785,357, filed on Mar. 14, 2013.

(51) Int. Cl.
*H01L 21/48* (2006.01)
*H01L 29/739* (2006.01)
(Continued)

(52) U.S. Cl.
CPC .............. *H01L 25/072* (2013.01); *H01L 21/77* (2013.01); *H01L 21/84* (2013.01); *H01L 24/24* (2013.01);
(Continued)

(58) Field of Classification Search
CPC ......... H01L 24/97; H01L 24/95; H01L 24/83; H01L 24/24; H01L 24/25; H01L 2224/32225; H01L 2224/92244; H01L 2224/82104; H01L 2224/95101; H01L 25/072; H01L 25/50; H01L 25/07; H01L 25/0655
USPC .......... 438/107, 127, 128, 142; 257/100, 202, 257/E21.35, E21.502
See application file for complete search history.

(56) References Cited

U.S. PATENT DOCUMENTS 6,331,063 B1 12/2001 Kamada et al.
7,972,031 B2 7/2011 Ray et al.
(Continued)

OTHER PUBLICATIONS

PCT/US14/26127 filed Mar. 13, 2014, "International Search Report and Written Opinion" dated Jul. 17, 2014, 11 pages.

*Primary Examiner* — Michael Trinh
(74) *Attorney, Agent, or Firm* — Patent Law Group LLP; Brian D. Ogonowsky

(57) ABSTRACT

A layer of microscopic, 3-terminal transistors is printed over a first conductor layer so that bottom electrodes of the transistors electrically contact the first conductor layer. A first dielectric layer overlies the first conductor layer, and a second conductor layer over the first dielectric layer contacts intermediate electrodes on the transistors between the bottom electrodes and top electrodes. A second dielectric layer overlies the second conductor layer, and a third conductor layer over the second dielectric layer contacts the top electrodes. The devices are thus electrically connected in parallel by a combination of the first conductor layer, the second conductor layer, and the third conductor layer. Separate groups of the devices may be interconnected to form more complex circuits. The resulting circuit may be a very thin flex-circuit.

25 Claims, 10 Drawing Sheets

(51) Int. Cl.
*H01L 25/07* (2006.01)
*H01L 21/77* (2006.01)
*H01L 21/84* (2006.01)
*H01L 25/00* (2006.01)
*H01L 27/12* (2006.01)
H01L 23/00 (2006.01)
H01L 25/065 (2006.01)
H01L 25/075 (2006.01)

(52) U.S. Cl.
CPC ............... *H01L 24/25* (2013.01); *H01L 24/82* (2013.01); *H01L 24/95* (2013.01); *H01L 24/97* (2013.01); *H01L 25/50* (2013.01); *H01L 27/12* (2013.01); *H01L 24/05* (2013.01); *H01L 24/06* (2013.01); *H01L 24/32* (2013.01); *H01L 24/73* (2013.01); *H01L 24/92* (2013.01); *H01L 25/0655* (2013.01); *H01L 25/0753* (2013.01); *H01L 2221/68381* (2013.01); *H01L 2224/05552* (2013.01); *H01L 2224/05555* (2013.01); *H01L 2224/06051* (2013.01); *H01L 2224/06181* (2013.01); *H01L 2224/24137* (2013.01); *H01L 2224/25105* (2013.01); *H01L 2224/25174* (2013.01); *H01L 2224/32225* (2013.01); *H01L 2224/73267* (2013.01); *H01L 2224/82104* (2013.01); *H01L 2224/92244* (2013.01); *H01L 2224/95085* (2013.01); *H01L 2224/95101* (2013.01); *H01L 2224/95115* (2013.01); *H01L 2224/95144* (2013.01); *H01L 2224/95145* (2013.01); *H01L 2924/10253* (2013.01); *H01L 2924/12041* (2013.01); *H01L 2924/1301* (2013.01); *H01L 2924/1305* (2013.01); *H01L 2924/13034* (2013.01); *H01L 2924/13062* (2013.01); *H01L 2924/13091* (2013.01)

(56) References Cited

U.S. PATENT DOCUMENTS

| | | | |
|---|---|---|---|
| 8,877,101 B2* | 11/2014 | Lowenthal | H01L 25/048 252/582 |
| 9,099,568 B2* | 8/2015 | Blanchard | H01L 21/84 |
| 2007/0040489 A1 | 2/2007 | Ray et al. | |
| 2012/0161196 A1* | 6/2012 | Lowenthal | H01L 25/048 257/100 |
| 2012/0164796 A1* | 6/2012 | Lowenthal | H01L 25/048 438/127 |
| 2012/0164797 A1* | 6/2012 | Lowenthal | H01L 25/048 438/127 |
| 2013/0221368 A1* | 8/2013 | Oraw | H01L 27/15 257/76 |

* cited by examiner

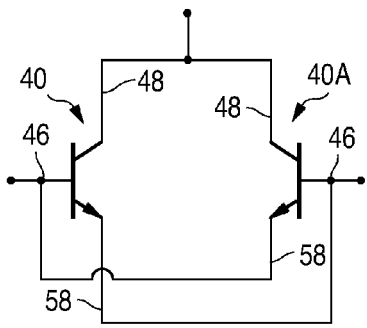
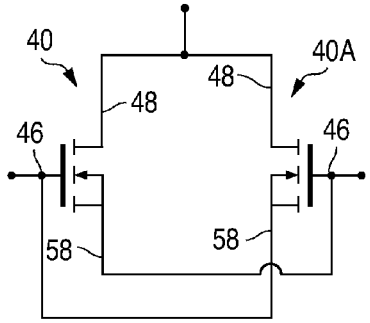
FIG. 9  FIG. 10
|  | MOS | BIPOLAR |
|---|---|---|
| TOP | GATE | EMITTER |
| INTERMEDIATE | SOURCE BODY | BASE |
| BOTTOM | DRAIN | COLLECTOR |
| EFFECT IF UPSIDE DOWN | GATE IS BOTTOM CONTACT. THEREFORE, AN OPEN CIRCUIT. | COLLECTOR AND EMITTER REVERSED WITH BASE FLOATING. REVERSE BIASED DIODE. |
FIG. 11
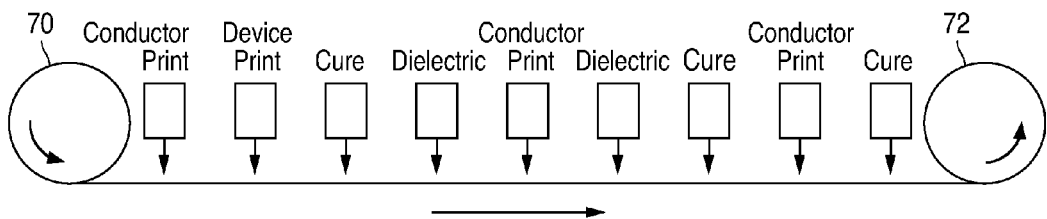
FIG. 12

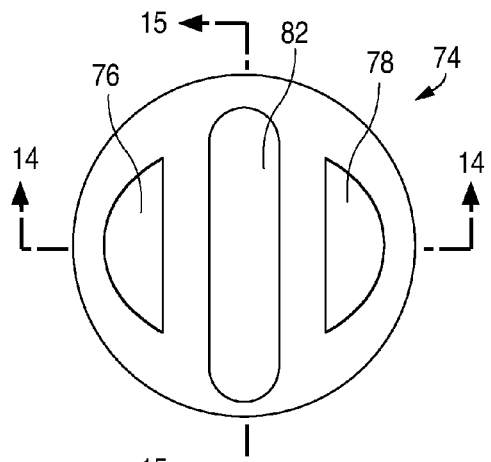
FIG. 13
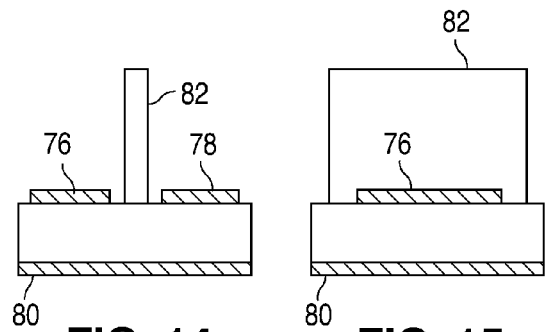
FIG. 14  FIG. 15
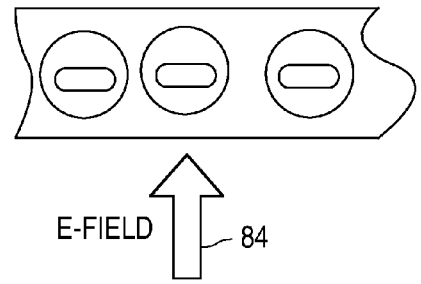
FIG. 16
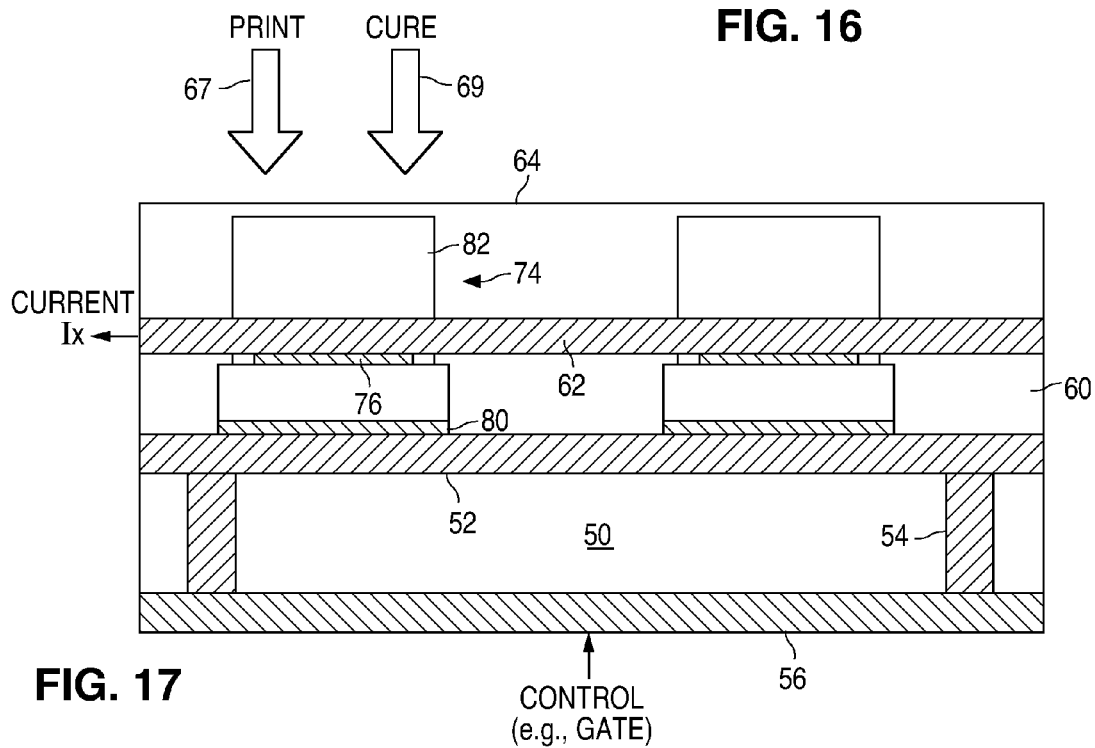
FIG. 17

THREE-TERMINAL PRINTED DEVICES INTERCONNECTED AS CIRCUITS

CROSS-REFERENCE TO RELATED APPLICATIONS

This application is a continuation-in-part of U.S. application Ser. No. 14/204,886, filed Mar. 11, 2014, now U.S. Pat. No. 9,099,568, issued on Aug. 4, 2015, by Richard Austin Blanchard, assigned to the present assignee and incorporated herein by reference.

FIELD OF THE INVENTION

This invention relates to printing pre-formed microscopic 3-terminal devices such as transistors or other circuits.

BACKGROUND

It is known, by the present assignee's own work, how to form and print microscopic 2-terminal vertical light emitting diodes (LEDs), with the proper orientation, on a conductive substrate and connect the LEDs in parallel. Details of such printing of LEDs can be found in US application publication US 2012/0164796, entitled, Method of Manufacturing a Printable Composition of Liquid or Gel Suspension of Diodes, assigned to the present assignee and incorporated herein by reference.

FIG. 1 is a cross-sectional view of a layer of LEDs 16 that may be printed using the following process. Each LED 16 includes standard semiconductor GaN layers, including an n-layer, and active layer, and a p-layer.

An LED wafer, containing many thousands of vertical LEDs, is fabricated so that the bottom metal cathode electrode 18 for each LED 16 includes a reflective layer. The top metal anode electrode 20 for each LED 16 is small to allow almost all the LED light to escape the anode side. A carrier wafer, bonded to the "top" surface of the LED wafer by an adhesive, may be used to gain access to both sides of the LED for metallization. The LEDs 16 are then singulated, such as by etching trenches around each LED down to the adhesive layer and dissolving the exposed wafer-bonding adhesive layer or by thinning the carrier wafer.

The microscopic LEDs are then uniformly infused in a solvent, including a viscosity-modifying polymer resin, to form an LED ink for printing, such as screen printing, or flexographic printing.

If it is desired for the anode electrodes 20 to be oriented in a direction opposite to the substrate 22 after printing, the electrodes 20 are made tall so that the LEDs 16 are rotated in the solvent, by fluid pressure, as they settle on the substrate surface. The LEDs 16 rotate to an orientation of least resistance. Over 90% like orientation has been achieved.

In FIG. 1, a starting substrate 22 is provided. If the substrate 22 itself is not conductive, a reflective conductor layer 24 (e.g., aluminum) is deposited on the substrate 22 such as by printing.

The LEDs 16 are then printed on the conductor layer 24 such as by screen printing with a suitable mesh, or by flexography, to control the thickness of the layer. Because of the comparatively low concentration, the LEDs 16 will be printed as a monolayer and be fairly uniformly distributed over the conductor layer 24.

The solvent is then evaporated by heat using, for example, an infrared oven. After curing, the LEDs 16 remain attached to the underlying conductor layer 24 with a small amount of residual resin that was dissolved in the LED ink as a viscosity modifier. The adhesive properties of the resin and the decrease in volume of resin underneath the LEDs 16 during curing press the bottom LED electrode 18 against the underlying conductor 24, making ohmic contact with it.

A dielectric layer 26 is then printed over the surface to encapsulate the LEDs 16 and further secure them in position.

A top transparent conductor layer 28 is then printed over the dielectric layer 26 to electrically contact the electrodes 20 and cured in an oven appropriate for the type of transparent conductor being used.

Metal bus bars 30-33 are then printed along opposite edges of the conductor layers 24 and 28 and electrically terminate at anode and cathode leads (not shown), respectively, for energizing the LEDs 16. The bus bars 30-33 will ultimately be connected to a positive or negative driving voltage.

FIG. 2 is a top down view of FIG. 1. The cross-section of FIG. 1 is a horizontal bisection of FIG. 2.

If a suitable voltage differential is applied to the anode and cathode leads, all the LEDs 16 with the proper orientation will be illuminated. FIG. 1 shows a light ray 38.

The above process is strictly for use with 2-terminal devices having a top electrode and a bottom electrode, since the locations of the LEDs on the substrate are random, and the LEDs can only be interconnected by sandwiching the LEDs between two conductive layers of any thickness.

It would be desirable to adapt the above-described process to create printed electrical circuits having other than vertical LEDs connected in parallel. Many types of electrical components use three terminals, such as MOSFETs, bipolar transistors, JFETs, thyristors, silicon controlled rectifiers, etc. Such components typically have three terminals on the top, for lateral devices, or two terminals on top and one on the bottom, for vertical devices. It is known to form thin film transistors by printing the various transistor layers over a substrate, but the performance of such transistors is poor due to the difficulty of printing a single crystal. If transistors (or other 3-terminal devices) could be more conventionally formed in a semiconductor wafer and then singulated to create microscopic devices for printing as an ink, the quality of the devices may be state of the art. However, heretofore it is not known how to design such devices or to interconnect such 3-terminal microscopic devices using printing.

SUMMARY

In one embodiment, a semiconductor wafer of 3-terminal devices, such as transistors, is formed. The transistors may be silicon based. The devices are formed in the wafer to have a bottom electrode, a top electrode, and an intermediate electrode that is located on a shelf somewhere between the top and bottom of the device. The starting wafer (e.g., silicon) is ultimately affixed to a carrier wafer, by an adhesive, to gain access to both surfaces of the devices when fabricating them.

The devices are singulated into individual devices by forming trenches around each device, such as to form, for example, hexagonal devices. The trenches extend down to the adhesive layer, and the adhesive layer is dissolved in a solution, releasing all the devices from the carrier wafer.

The devices are then uniformly mixed into a solution to form an ink. The shapes of the devices cause a vast majority them to be printed in the desired orientation on a substrate.

The devices are then printed on a conductor layer over a substrate, and the ink is cured (heated and evaporated), so that the bottom electrodes make ohmic contact with this first conductor layer. The devices will be printed as a monolayer due to the relatively low density of the devices in the solution.

In all printing steps, the printing may be by screen printing or by flexography. Flexography is more conducive to a roll-to-roll process.

A first dielectric layer is then printed over the first conductor layer. The first dielectric layer does not cover the intermediate electrode. A second conductor layer is then printed, which contacts the intermediate electrode but does not cover the top electrode. The various thin printed layers self-planarize by a strong surface tension so that the layer does not cover any features "above" the thickness of the layer. Alternatively, the layers may be blanket etched after curing to expose any electrodes.

A second dielectric layer is then printed over the second conductor layer but not over the top electrode. A third or top conductor layer is then printed to contact the top electrode of the device.

Therefore, the top electrodes of the devices are connected in parallel, the bottom electrodes are connected in parallel, and the intermediate electrodes (or a subset of them) are connected in parallel for conducting a wide range of currents.

Metal bus bars may then be printed to contact one or more of the three conductor layers, and the layers are coupled to suitable operating voltages and control voltages.

The functions of the three electrodes are selected such that, if some of the devices are printed upside down or make a poor connection, there is no adverse effect on the functions of the proper orientated devices.

Different areas of the substrate may be printed with different devices or the same devices, and the devices in each area are connected in parallel. The various areas may be interconnected by printed traces to form circuits. Such circuits may form logic gates or switchable LEDs, or more complex circuits.

In another embodiment, two electrodes are formed on the top surface of the devices and one electrode is formed on the bottom surface. A metal fin on the top of the devices allows the rotational orientation of the devices to be controlled, prior to curing, using an electric or magnetic field. The devices are printed in a narrow strip using a hydrophobic mask during printing so that the devices are printed in a line. A bottom conductor layer contacts the bottom electrode, and two printed, planar conductor layers contact the two electrodes on top.

The printing process may use a roll-to-roll process at atmospheric pressures.

Other embodiments are disclosed.

BRIEF DESCRIPTION OF THE DRAWINGS

FIG. 1 is taken across a horizontally bisected FIG. 2.

FIGS. 9 and 10 illustrate how some transistors may be "incorrectly" interconnected by improper orientations of the transistors when printing, where the interconnections do not adversely affect the functions of the properly oriented transistors.

FIG. 11 is a chart identifying a choice of functions for the top, bottom, and intermediate electrodes for MOSFETs and bipolar transistors that addresses the effect of the devices being printed upside down.

FIG. 12 illustrates a roll-to-roll process that may be used to form the circuits.

FIG. 13 is a top down view of another 3-terminal transistor having two terminals on top, where a projecting fin is used to achieve the proper rotational orientation of the transistor, in accordance with another embodiment of the invention.

FIG. 14 is a cross-sectional view of the transistor of FIG. 13 along line 14-14.

FIG. 15 is a cross-sectional view of the transistor of FIG. 13 along line 15-15.

FIG. 16 illustrates the transistors of FIG. 13 being properly oriented on a substrate after printing.

FIG. 17 is a cross-section of a small portion of a printed layer of the transistors of FIG. 16 connected in parallel using two planes of conductor layers.

Elements that are similar or identical in the various figures are labeled with the same numeral.

DETAILED DESCRIPTION

The 3-terminal devices used in embodiments of the present invention may be less than the diameter of a human hair, rendering them essentially invisible to the naked eye when the devices are sparsely spread across a substrate. The sizes of the devices may range from about 10-200 microns across. The number of micro-devices per unit area may be freely adjusted when applying the micro-devices to the substrate. The devices may be printed as an ink using screen printing, flexography, or other forms of printing. Conventional designs for 3-terminal devices may be easily adapted for forming the micro-devices of the present invention. The precision of photolithography is well within the precision needed to form the micro-devices. Since many of the micro-devices will be operating in parallel, the efficiency of each micro-device is not critical.

Figure 3:
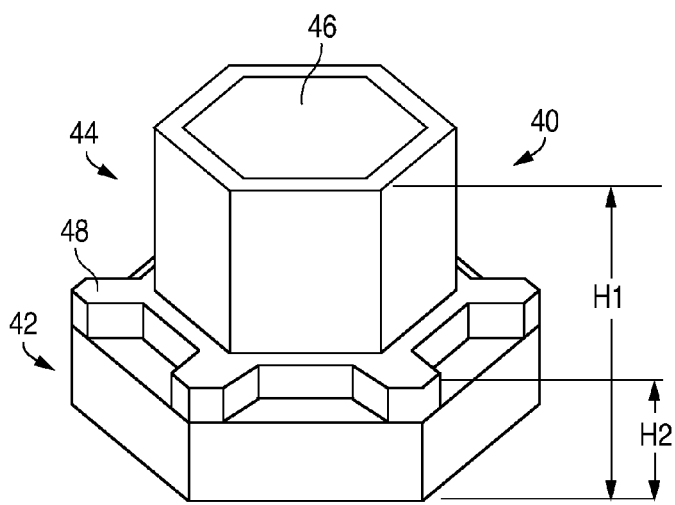
FIG. 3 is a perspective view of a single 3-terminal transistor that has been singulated from a wafer, in accordance with one embodiment of the invention. The device is mixed into a solution to form an ink for printing on a substrate.

FIG. 3 is a perspective view of a 3-terminal device 40 that can be suspended in a solvent and printed as an ink on a substrate. The device 40 may be a bipolar transistor, a MOSFET, a JFET, a tri-MOS device, or any other 3-terminal device, generally including two current carrying terminals and a control terminal. The devices can be lateral or vertical transistors, since the positions of the three electrodes do not dictate the locations of the semiconductor layers/regions or gates in the devices. The electrodes may contact any location in the device using vias.

The devices 40 are completely formed on a semiconductor wafer, including the electrode metallizations, by using one or more carrier wafers during the processing to gain access to both surfaces for metallization. Although the growth wafer may be silicon, the carrier wafer may be any material. The silicon wafer is affixed to the carrier wafer using an adhesive. The shape of each device 40 is defined by masking and etching. Various layers or regions may be doped using masked implantation or by doping the layers while being epitaxially grown. After the devices are formed on the wafer, trenches are photolithographically defined and etched in the front surface of the wafer around each device down to the adhesive layer. A preferred shape of each device 40 is hexagonal. The trench etch exposes the underlying wafer bonding adhesive. The adhesive is then dissolved in a solution to release the devices 40 from the carrier wafer. Singulation may instead be performed by thinning the back surface of the carrier wafer until the devices 40 are singulated. The microscopic devices 40 are then uniformly infused in a solvent, including a viscosity-modifying polymer resin, to form an ink for printing, such as screen printing or flexographic printing.

Details regarding shaping vertical LEDs (2-terminal devices) in a wafer and then singulating the LEDs for printing as an ink are described in US application publication US 2012/0164796, entitled, Method of Manufacturing a Printable Composition of Liquid or Gel Suspension of Diodes, assigned to the present assignee and incorporated herein by reference. One skilled in the art may adapt such processes for forming the 3-terminal device 40.

The device 40 has two sections: a lower section 42 (or base portion) and an upper section 44. The upper section 44 is made relatively tall and narrow so that the devices 40 are rotated in the solvent, by fluid pressure, as they settle on the substrate surface. The devices 40 rotate to an orientation of least resistance. Over 90% like orientation has been achieved, although satisfactory performance may be achieved with over 75% of the devices 40 being in the same orientation.

Figure 4:
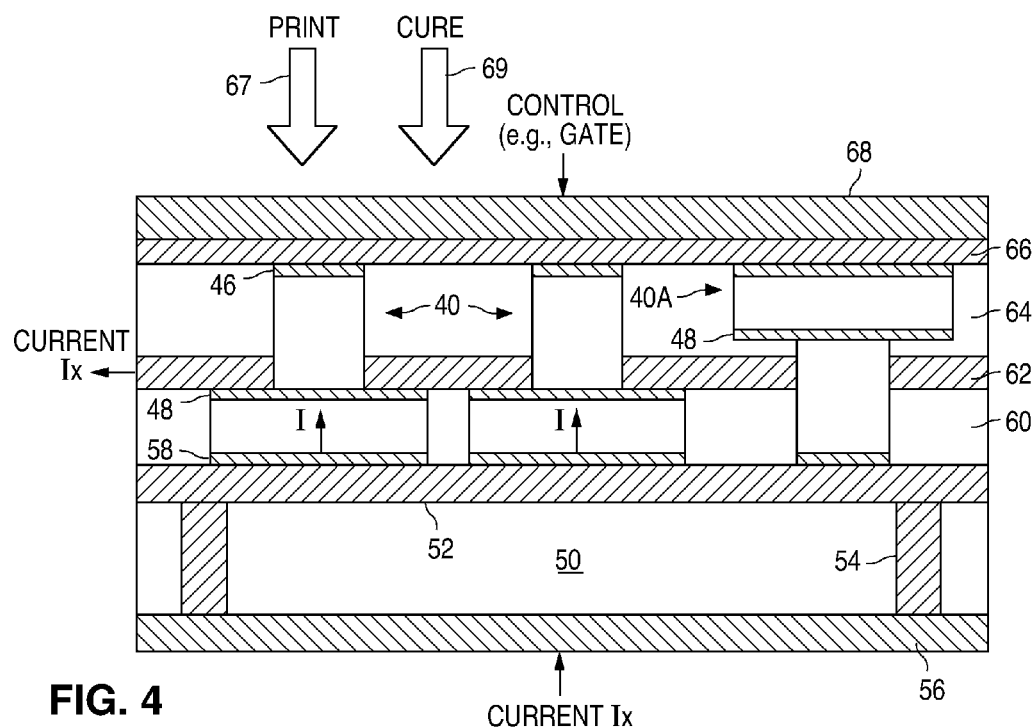
FIG. 4 is a cross-section of a small portion of a printed layer of the transistors connected in parallel using three planes of conductor layers.

The lower section 42 should be shaped so that the device 40 sits flat on the substrate after the ink is cured. FIG. 4 illustrates three printed devices 40, where only two are printed with the correct orientation.

The device 40 includes a metal top electrode 46, a metal intermediate electrode 48, and a metal bottom electrode (not shown in FIG. 3). The shape of the intermediate electrode 48 provides a large side surface area for good electrical contact with an intermediate conductor layer.

The intermediate electrode 48 should be offset with respect to the middle of the device 40 so that an improper orientation of the device 40 after printing results in the intermediate electrode 48 not electrically contacting the intermediate conductor layer. In the example, the intermediate electrode 48 is below the middle of the device 40 (i.e., $H2 < \frac{1}{2} H1$).

In FIG. 4, a starting substrate 50 is provided. The substrate 50 is preferably thin and flexible for light weight, low cost, good heat conduction to air or a heat sink, and ease of processing. The substrate 50 may be a suitable polymer, such as polycarbonate, PMMA, or PET, and may be flexible so as to be dispensed from a roll. The substrate 50 can be any size suitable for the ultimate product. The substrate 50 may be a conventional flex-circuit substrate, where metal (e.g., copper) traces have been already formed on the substrate 50 by conventional means prior to the below processing steps.

If the substrate 50 itself is not conductive or does not already have metal traces formed on it as a flex-circuit, a conductor layer 52 (e.g., aluminum) is deposited on the substrate 50 such as by printing. Conductive vias 54 through the substrate 50 may be used to couple the conductor layer 52 to a metal layer 56 formed on the bottom surface of the substrate 50.

The devices 40 are then printed on the conductor layer 52 such as by screen printing with a suitable mesh, or by flexography, to control the thickness of the layer. Because of the comparatively low concentration, the devices 40 will be printed as a monolayer and be fairly uniformly distributed over the conductor layer 52.

The solvent is then evaporated by heat using, for example, an infrared oven. After curing, the devices 40 remain attached to the underlying conductor layer 52 with a small amount of residual resin that was dissolved in the ink as a viscosity modifier. The adhesive properties of the resin and the decrease in volume of resin underneath the devices 40 during curing press the bottom electrode 58 against the underlying conductor layer 52, making ohmic contact with it.

A thin dielectric layer 60 is then printed over the surface to cover the conductor layer 52 and further secure the devices 40 in position. The dielectric layer 60 is designed to self-planarize during curing, by surface tension, so as to pull off of the top electrode 46 and the intermediate electrode 48. Therefore, etching the dielectric layer 60 is not required. If the dielectric layer 60 covers the electrodes 46/48, then a blanket etch may be used to expose the electrodes 46/48.

An intermediate conductor layer 62 is then printed over the dielectric layer 60 to electrically contact the intermediate electrode 48 and is cured in an oven appropriate for the type of conductor being used. The various conductor layers may be metal (or contain metal) or be any other type of printable conductor layer.

Another thin dielectric layer 64 is printed over the intermediate conductor layer 62 so as not to cover the top electrode 46.

A top conductor layer 66 is then printed over the dielectric layer 64 to electrically contact the top electrode 46 and is cured in an oven appropriate for the type of conductor being used.

A thicker metal layer 68 may then be printed over the conductor layer 66 for improving electrical conductivity and/or heat conduction. The intermediate conductor layer 62 may be contacted by a metal bus bar near an exposed edge.

Figure 1:
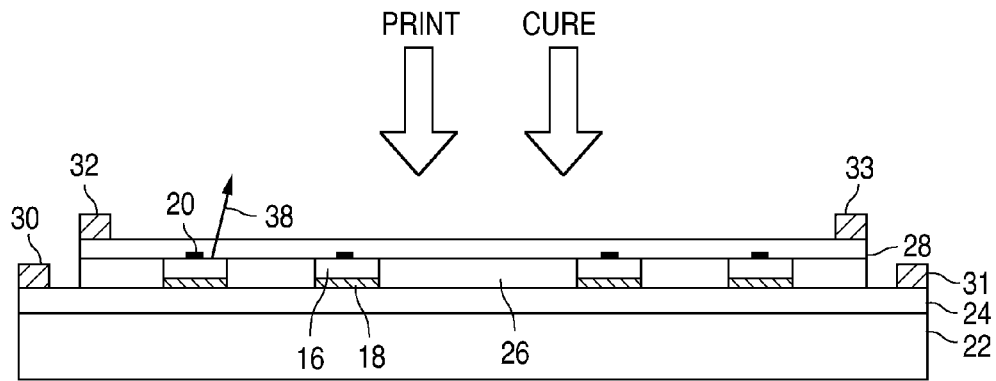
FIG. 1 is a cross-section of a monolayer of printed, microscopic vertical LEDs that may be formed using the assignee's prior art process.
Figure 2:
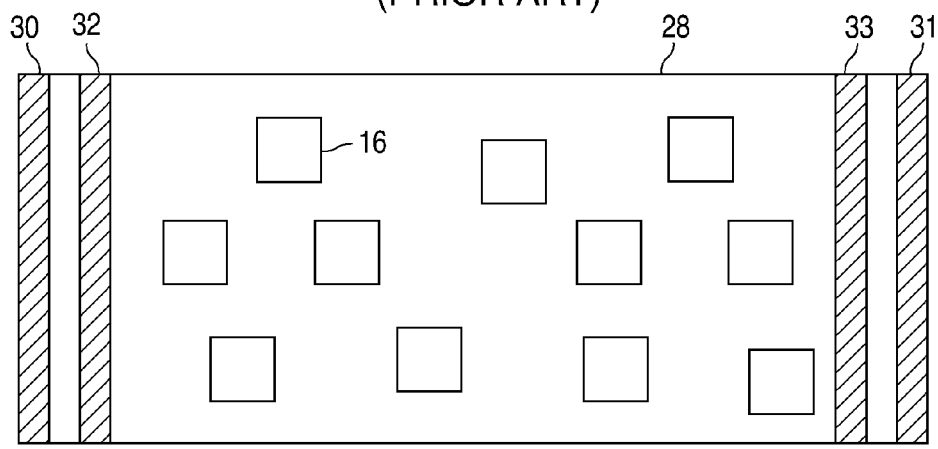
FIG. 2 is a top down view of the structure of FIG. 1, where

FIG. 4 illustrates that the only steps needed to form the structure of FIG. 4 are printing and curing steps 67 and 69. The random pattern of the devices 40 may resemble the pattern of LED 16 in FIG. 2.

FIG. 4 illustrates that the rightmost device 40A is oriented in the opposite direction. However, the intermediate electrode 48 is left floating, so the device 40A does not operate and has no effect on the resulting circuit.

The printed devices 40 are connected in parallel by the conductor layers. Suitable operating voltages and control voltages are applied to the conductor layers to operate the devices 40. In the example of FIG. 4, the top electrode 46 is the control electrode for the devices 40 (e.g., for gates or bases). The remaining two electrodes are the current carrying electrodes (e.g., source/drain, emitter/collector). Since the intermediate electrode 48 of the improperly oriented device 40A is floating, the device 40 remains off and an open circuit.

Figure 5:
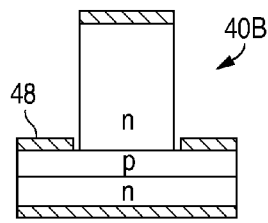
FIG. 5 illustrates how the transistor of FIG. 4 may be an npn bipolar transistor.

FIG. 5 illustrates how the device 40 may be an npn bipolar transistors 40B, where the intermediate electrode 48 is the base electrode. The intermediate electrode 48 may be connected to any of the other semiconductor layers in the device 40B using a via.

Figure 6:
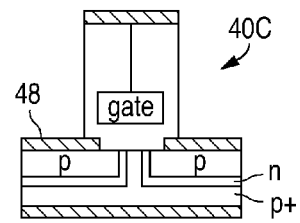
FIG. 6 illustrates how the transistor of FIG. 4 may be a p-channel MOSFET.

FIG. 6 illustrates how the device 40 may be a p-channel DMOS FET 40C, where the intermediate electrode 48 is the source electrode. The intermediate electrode 48 may be connected to any of the other layers in the device 40C using a via. This device is shown having a floating n-type body region.

Figure 7:
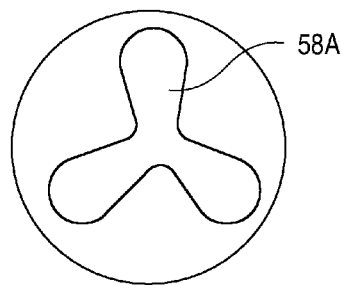
FIGS. 7 and 8 are some examples of metal designs on the bottom surface of the transistors that increase the reliability of the electrical connection and ensure the transistors will be supported substantially vertically on the bottom conductor layer.
Figure 8:
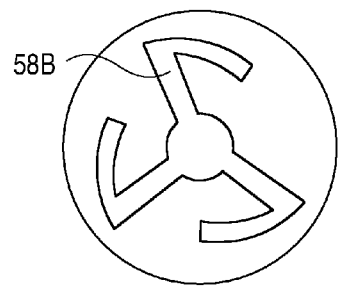

FIGS. 7 and 8 illustrate possible patterns of the metal bottom electrodes 58A and 58B. Such patterns form a good electrical connection to the conductor layer 52 and, since the electrodes have three "legs," the electrodes 58A and 58B will lay flat on the conductor layer 52 for a good electrical connection.

Any number of the devices 40 may be connected in parallel for handling a wide range of currents. Small groups of the devices 40 may be printed in separate regions on the substrate 50, and the various conductor layers may be patterned so that the devices 40 in each group are connected in parallel, but each group is electrically isolated from one another. Therefore, each group forms a separate component. The selective printing of any of the layers may be by screen printing, where a mask on the screen mesh determines the deposition, or by flexography, where a pattern on a rolling plate determines the deposition. The groups may then be selectively interconnected using "programming" conductor traces on the substrate 50 to form more complex circuits, such as logic circuits. A metal flex-circuit pattern on the substrate 50 may be used to interconnect the groups of devices 40 for form the logic circuits.

FIG. 9 illustrates how the improper orientation of the device 40A in FIG. 4 does not adversely affect the operation of the properly oriented devices 40 connected in parallel. The device 40/40A is assumed to be an npn bipolar transistor with a top electrode 46 for the base, a bottom electrode 58 for the emitter, and an intermediate electrode 48 for the collector. Since the device 40A is undesirably oriented upside down during printing (shown in FIG. 4), its base is shorted to the emitter of the device 40 and its emitter is shorted to the base of the device 40. When the base/emitter junction of the device 40 is forward biased to turn on the device 40, the device 40A remains off and has no effect on the operation of the device 40. Note that, by using an intermediate electrode 48 that is offset from the middle of the device 40 (as shown in FIGS. 3 and 4), the intermediate electrode 48 of the device 40A would be floating, making its effect even more insignificant.

FIG. 10 is similar to FIG. 9 but the devices 40 and 40A are n-channel MOSFETs.

FIG. 11 is a table showing possible connections for the top, bottom, and intermediate electrodes of just the device 40 formed as a MOSFET or a bipolar transistor so that improper orientations do not adversely affect the functions of the properly oriented devices 40 connected in parallel.

Some devices, such as bipolar transistors and MOSFETs, may be fabricated as "symmetrical" devices so that certain terminals, such as the emitter and collector or the source and drain, may be reversed without losing functionality. Therefore, if such symmetrical devices are printed upside down, they still operate properly.

FIG. 12 schematically illustrates one possible assembly line for manufacturing the circuits by printing in a roll-to-roll process. The roll 70 contains the substrate material, and the roll 72 is a take-up roll. The various stations are labeled. In the example used to form the embodiment of FIG. 4, the process sequentially prints the various layers and cures the layers. Similar roll-to-roll processes, performed under atmospheric conditions, may be used to form the other embodiments.

FIGS. 13-17 illustrate another embodiment of the invention, where there are only two levels of conductor layers, and the 3-terminal device 74 has two electrodes 76/78 on its top surface and one electrode 80 on its bottom surface. The device 74 has a fin 82, such as formed of metal or a magnet, which causes the devices 74 to be properly oriented on the substrate 50 (FIG. 16) after printing. FIG. 14 is a cross-sectional view along line 14-14 in FIG. 13, and FIG. 15 is a cross-sectional view along line 15-15 in FIG. 13. The fin 82 is also affected by an electric field 84 (FIG. 16) that is applied prior to the curing of the ink to impart a rotational force to the devices 74 until they have the same rotational orientation, as shown in FIG. 16. The field may instead be a magnetic field.

The devices 74 are preferably formed so that their performance is symmetrical about the fin 82, meaning that the functions of the electrodes 76 and 78 are identical. For example, the electrodes 76 and 78 may contact identical p-type regions (e.g., emitter and collector) of a lateral PNP transistor, and the bottom electrode 80 may be the base electrode.

The devices 74 are printed in a linear line, shown in FIG. 16, by a hydrophobic mask that is patterned on the substrate 50. The hydrophobic mask only allows the ink to reside in a very narrow opening in the mask. Since the devices 74 are fairly sparsely distributed in the ink, the printed devices 74 form a line.

To form a circuit using the devices 74, the bottom conductor layer 52 is printed, followed by the printing, aligning, and curing of the devices 74. The dielectric layer 60 is then printed. The conductor layer 62 is printed using a patterned hydrophobic mask so that the parallel conductor layer strips for contacting the top electrodes 76/78 are physically separated. The devices 74 are thus connected in parallel. The top dielectric layer 64 is then printed. The operating voltages and control voltage are then applied to the conductors. The circuit of FIG. 17 may thus be formed by printing and curing steps 67 and 69 in a roll-to-roll process.

The embodiments of FIGS. 13-17 are particularly useful for low current circuits such as programmable gate arrays, where small groups of the devices 74 are programmably interconnected using a metal mask to perform logic functions.

The various directional attributes used herein, such as bottom, top, and vertical, are not to be construed to convey absolute directions relative to the Earth's surface but are used to convey orientations relative to the enclosed figures when the drawing sheets are held upright. In an actual embodiment, such terms still apply to the product regardless of the absolute orientation of the product relative to the Earth's surface.

Figure 18:
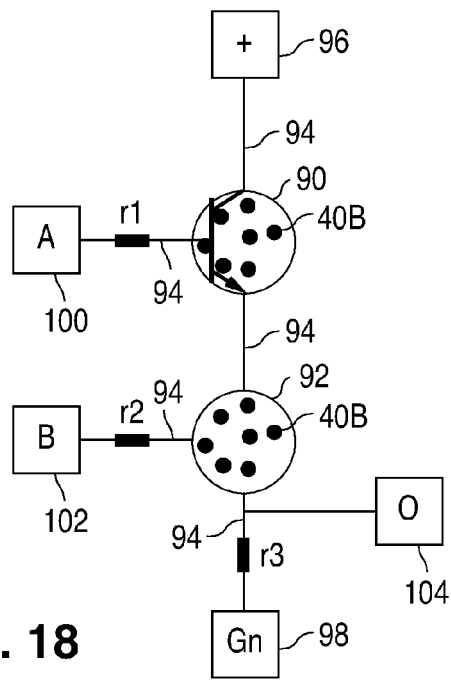
FIG. 18 illustrates interconnecting groups of printed transistors to form a logic circuit.

FIG. 18 illustrates two groups, 90 and 92, of microscopic npn bipolar transistors, such as the npn bipolar transistors 40B in FIG. 5, printed on a substrate, where the transistors 40B in each group are connected in parallel so that each group acts as a single transistor. The print patterns for the transistors 40B and conductor layers form the groups as circular spots, but any shaped spot may be used. The interconnections of the groups in FIG. 18 cause the circuit to be an AND gate. The printed conductive traces 94 connect to the three conductor layers, shown in FIG. 4, in each group. The two transistors (i.e., groups 90 and 92) are connected in series between the supply voltage terminals 96 and 98, the bases of the transistors are connected to the input terminals 100 and 102, and the output terminal 104 is connected to the emitter of the transistor formed by group 92. The various input/output terminals may be located near the edges of the substrate or proximate to the groups. The AND gates, or other types of logic circuits, may be further interconnected on the substrate to form more complex circuits.

In another embodiment, the groups 90/92 contain printed MOSFETs or other types of transistors or devices.

The conductive traces 94 may be printed using any suitable technique, such as screen printing, flexography, inkjet, etc. In another embodiment, the conductive traces 94 may be formed by conventional masking and deposition/etching processes after the groups have been formed by a printing process.

Resistors r1 and r2 are shown connected between the input terminals 100/102 and the bases for current control. Due to the simplicity of resistors, the resistive material may be directly patterned on the substrate using flexography or screen printing. Either the shape of the resistive material or the position of a connector along the length of the resistor may determine the resistance. A resistor may also be included as part of each transistor 40B die. Capacitors may also be formed by printing the layers of the capacitors with a dielectric layer between conductive layers.

The substrate may contain hundreds or thousands of such AND gates, or other gates (e.g., NOR, NAND, OR, etc.), and the gates may be interconnected to form more complex functions. In such a case, the gates are equivalent to a programmable gate array. For a programmable circuit, the groups may be initially unconnected, and a programming mask for the interconnections customizes the interconnections for the final circuit. Three-dimensional connector layers may be used to allow the crossing over of traces. Some device groups may include transistors and other groups may contain other devices, such as diodes, LEDs, etc. A transistor may be connected as a diode. Analog circuits may also be formed by interconnecting the various groups.

Due to the random but substantially uniform distribution of the transistors 40B in the ink, each group of the same area will have approximately the same number of transistors 40B. Minor differences in the number of transistors 40B in a group will not affect the performance of a logic circuit. In one embodiment, there may be about 10 identical devices in each group due to the low currents required. The cost of the transistors 40B in a single group, representing a single transistor, is about 0.143 cents. So the resulting circuit board may be made relatively inexpensively.

Figure 19:
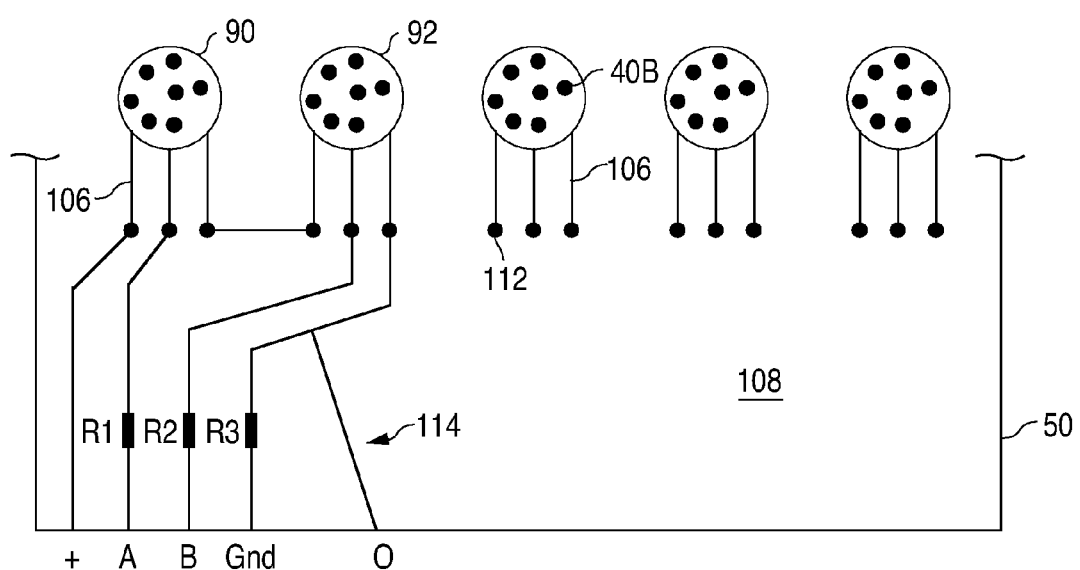
FIG. 19 illustrates how the leads for the various groups of devices may be brought to a patch area of the substrate for interconnecting the groups. In another embodiment, the leads of logic gates (e.g., NAND gates) made from the groups may be brought to the patch area or may be interconnected in other manners.

As shown in FIG. 19, to simplify the programming of the groups, which may be printed in an ordered 2-dimensional array, conductive traces 106, originating at the conductor layers (FIG. 4) for all the groups, may terminate at a designated patch area 108 on the substrate 50. These traces 106 may be part of the "generic" design of the circuit, which is then later customized for a particular use. This enables the printing process for forming the traces 106 to be optimized for connection to the conductor layers in the groups and the subsequent programming process to be optimized for interconnecting the ends 112 of the traces 106. For example, the programming process may be performed at a time after the circuit board has been fabricated, and the programming step may be performed by special equipment under computer control.

In the example of FIG. 19, the programming in the patch area 108 forms the AND gate of FIG. 18. For more complex circuits, the programming traces 114 may need to cross, and multiple layers may be formed to avoid shorting of the traces. Resistors R1-R3 may also be printed at any time during the fabrication of the circuit.

In another embodiment, the groups of devices 40B may be initially interconnected, proximate to the groups, to form separate logic gates, such as AND, NAND, and NOR gates, and the leads for each gate terminate in the patch area 108 for later programming to customize the substrate for a particular customer. Accordingly, the generic circuit forms a programmable gate array. The resulting circuit may be very thin and can be flexible or rigid, depending on the substrate 50 used.

A plurality of spaced patch areas may be provided to simplify routing of the interconnections. In one embodiment, the terminals for all the input signals are provided on one level in a patch area, and the output terminals are provided on another level.

If the programming of the interconnections is complex, directly printing the interconnections in an X-Y plane on the substrate 50 may be insufficient. In this context, directly printing on the substrate 50 means that no conductor mask on the substrate 110 is used to define the traces, where the mask would typically be defined using photolithography. Direct printing of conductors on the substrate is limiting, since a minimum spacing between conductors is about 30 microns to avoid cross-bridging, and thin conductors have a tendency to break up by surface tension.

In situations where it is not desired for the conductor lines to be directly printed, a mask layer is first formed on the substrate, followed by the deposition of the conductor ink over the mask layer, then curing, then removing any excess conductor material by etching or removing the mask.

Figure 20:
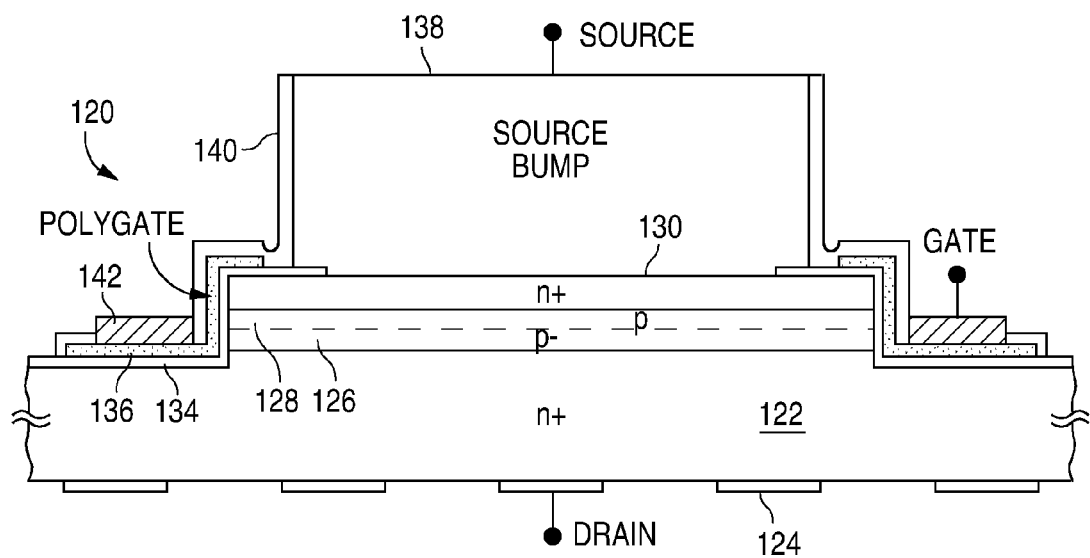
FIG. 20 is a cross-section of a printable vertical MOSFET that may be interconnected in the manner shown in FIGS. 4 and 19.
Figure 21:
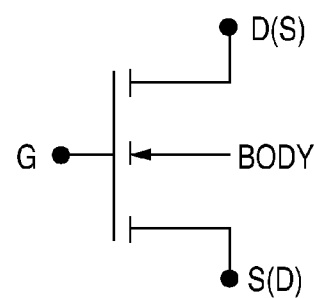
FIG. 21 is a MOSFET symbol representing the MOSFET of FIG. 20, showing a floating body region.

FIG. 20 is a cross-sectional view of a microscopic MOSFET 120 that may be infused in an ink solution, along with many thousands of identical MOSFETs 120, and printed over the substrate 50. The MOSFETs 120 may be represented by the 3-terminal printed devices in FIG. 4. FIG. 21 is a standard symbol for the MOSFET 120. The body may be floating to form a symmetrical MOSFET, or the body may be connected to the source, depending on the application. Fabrication of the MOSFET 120 on a semiconductor wafer may use conventional techniques.

In the MOSFET 120, an N+ semiconductor substrate 122 may form the drain. Metal drain electrodes 124 are formed on the bottom surface. A P− body region 126 is grown over the substrate 122, followed by a P layer 128 and an N+ source layer 130. The P layers 126/128 form the body region that is inverted by a biased gate to create a conductive vertical channel electrically connecting the source to the drain. The semiconductor layers are etched to form a ring that exposes the side of at least the P layers 126/128, and a gate dielectric 134 is deposited. A conductive gate 136 (e.g., doped polysilicon) is formed in a ring around the body region. A metal source electrode bump 138 is then formed, and a dielectric 140 is formed to expose a contact area for the gate 136 and insulate the sides of the source electrode 138. The gate electrode 142 is then deposited. The MOSFET 120 has a relatively wide gate 136 since the gate 136 forms a ring around the perimeter. Three conductor layers are used to contact the three electrodes of the MOSFET 120, as shown in FIG. 4

Figure 22:
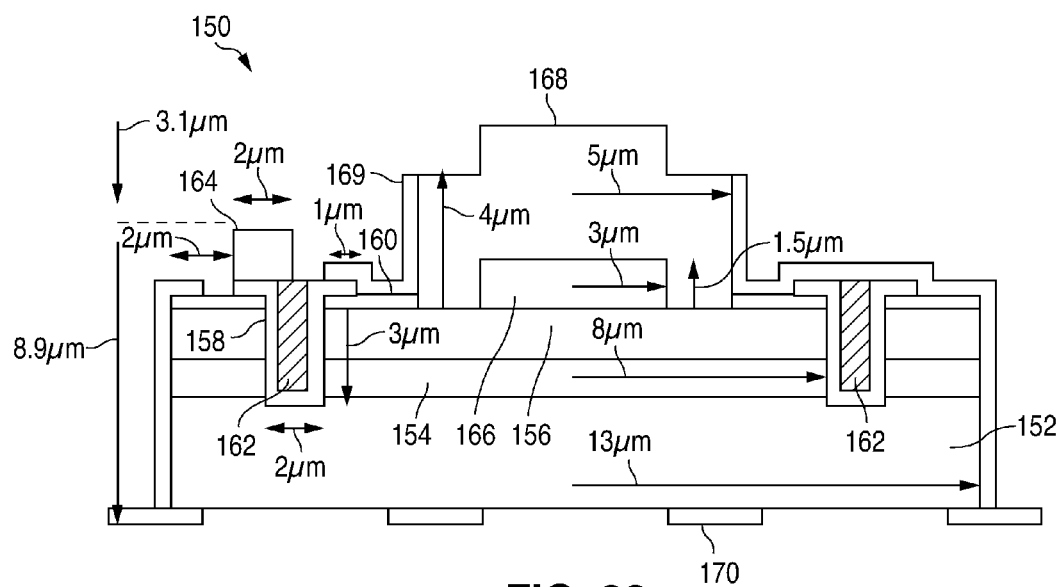
FIG. 22 is a cross-section of another embodiment of a printable MOSFET.

FIG. 22 is a cross-sectional view of another embodiment of a microscopic MOSFET 150 that may be printed and interconnected as described above. The MOSFET 150 conducts current vertically and has a trenched gate. The MOSFET 150 may be a P-channel or N-channel MOSFET, but we will assume it is an N-channel MOSFET. Although the MOSFET 150 may be symmetrical, it will be assumed for simplicity that the substrate forms the drain.

Over an N+ substrate 152, is epitaxially grown a P− body 154. An N+ source 156 is epitaxially grown over the P− body 154. The dopants may be implanted. A ring is then etched through the source 156 and body 154 near the edge of the device for forming a trenched gate. A thin gate dielectric 158 then covers the trench walls, and a thicker dielectric 160 covers the top area of the source 156. The trench is then coated with or filled with a conductive doped polysilicon to form the gate 162. A metal layer is then deposited to form a gate electrode(s) 164 and a source contact 166. A metal source bump 168 is then formed over the source contact 166 for vertically spacing the top of the bump 168 (forming the source electrode) from the gate electrode 164 so the gate electrode 164 and the top of the bump 168 can be contacted by two different levels of conductor layers, as shown in FIG. 4. A dielectric layer 169 insulates the sides of the bump 168. Metal "dots" 170 (the drain electrodes) are deposited on the bottom of the N+ substrate 152.

The shape of the MOSFET 150 causes the MOSFET 150 to settle on the conductor layer (e.g., conductor layer 52 in FIG. 4) in the proper orientation after printing and curing. If the MOSFET is made symmetrical (floating body), then MOSFETs with opposite orientations will still operate perfectly.

Figure 23:
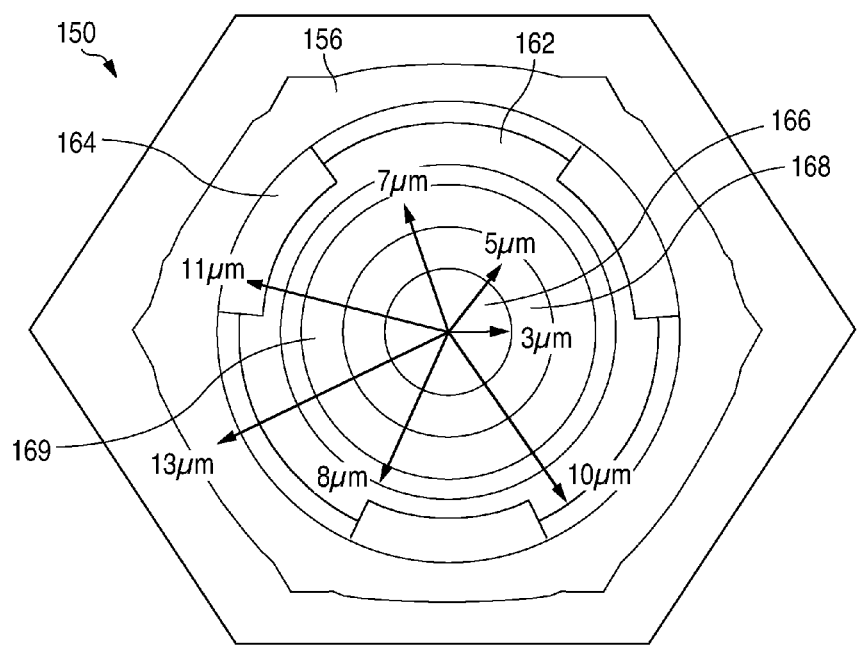
FIG. 23 is a top down view of the MOSFET of FIG. 22.

FIG. 23 is a top down view of the MOSFET 150 showing its generally hexagonal shape. Note that the metal gate electrodes 164 are distributed around the circular gate.

The dimensions of the MOSFET 150 are labelled in FIGS. 22 and 23.

Figure 24:
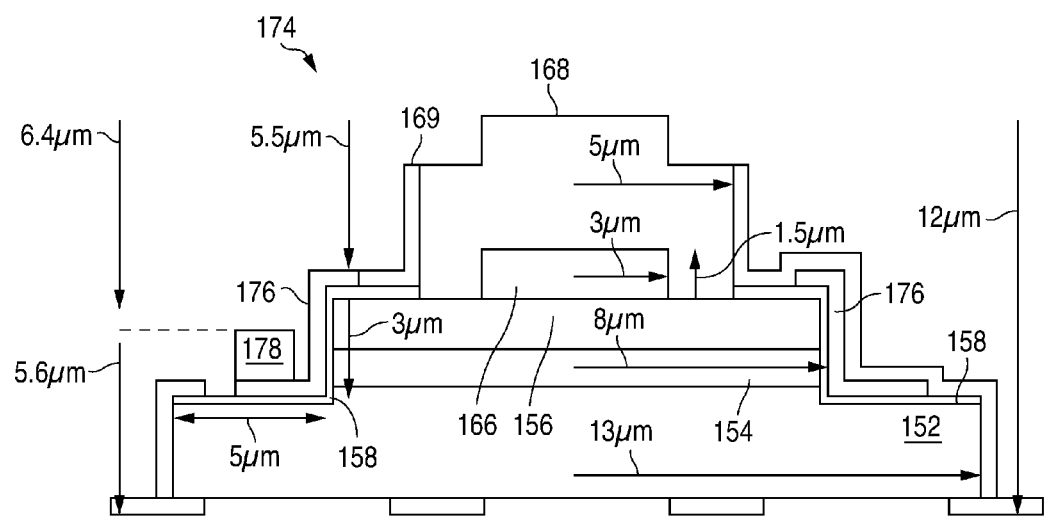
FIG. 24 is a cross-section of another embodiment of a printable MOSFET that is similar to the MOSFET of FIG. 20.

FIG. 24 illustrates a MOSFET 174 generally similar to the MOSFET 150 of FIG. 22 except that the polysilicon gate 176 is formed in an etched trench that extends to the edge of the die. This allows the metal gate electrode 178 to be further vertically displaced from the top of the metal source bump 168 to ease the tolerances when forming the conductor layers that electrically contact the gate electrode 178 and the top of the bump 168.

Figure 25:
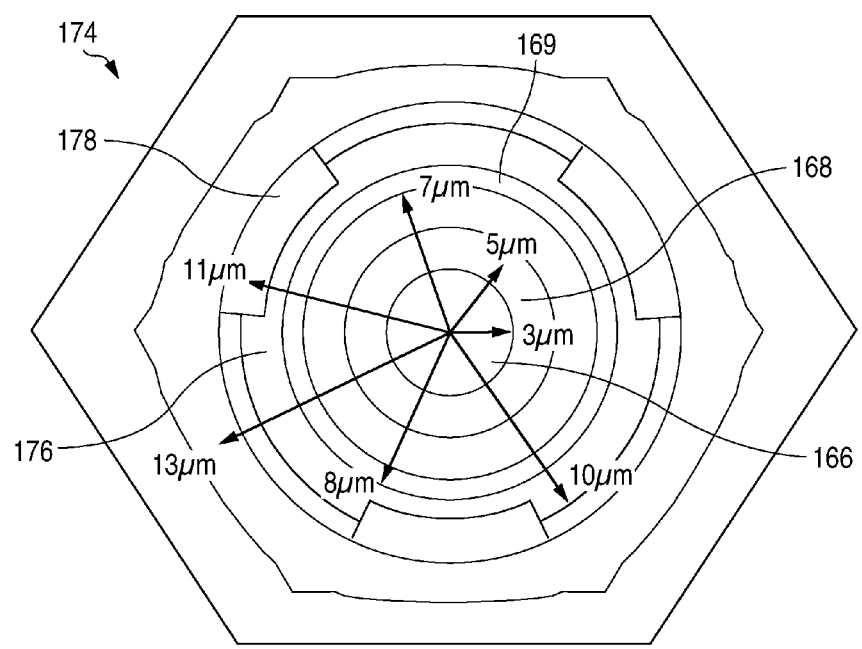
FIG. 25 is a top down view of the MOSFET of FIG. 24.

FIG. 25 is a top down view of the MOSFET 174.

Another advantage of the gate electrode locations in the printable MOSFET dies of FIGS. 20-25 is that the gate electrodes are displaced laterally from the edge of the die. Therefore, any stray metal, such as from a conductor layer, that covers a side of the die cannot contact the gate electrode.

For a programmable circuit, the MOSFETs of FIGS. 20-25 may be printed in separate groups on any type of substrate, where the MOSFETs in a group are connected in parallel, as shown in FIGS. 4 and 19. Any number of MOSFETs may be in a single group, such as 1-10, and three leads extend from each group. Groups may include any other devices, such as diodes. The groups may then be interconnected by a conductive trace pattern to form many different types of circuits, such as logic gates, latches, memories, etc. The groups may form a large 2-dimensional or 3-dimensional array. Many different types of customized circuits may be formed using the same generic array of groups.

Figure 26:
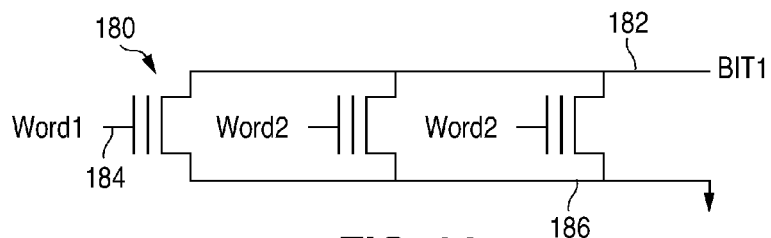
FIG. 26 is a schematic diagram of a row in a NOR flash memory array that may be printed using groups of MOSFETs connected in parallel (so each group represents a single MOSFET), where the groups are interconnected to form the circuit depicted in FIG. 26.

FIG. 26 illustrates a portion of a row in a NOR flash memory formed using printed floating gate MOSFETs 180, where each MOSFET symbol represents a very small "dot" (or group) of printed microscopic MOSFETs, where the MOSFETs in a dot are connected in parallel by the conductor layers (FIG. 4) in the dot. There may be a large 2-dimensional array of such dots, forming many addressable rows of memory elements. The three leads from each dot are interconnected as shown in FIG. 26 by metal traces. The state of any MOSFET is controlled by voltages applied to bit lines 182 (Bit1, Bit2, . . . ) and word lines 184 (Word1, Word2, . . . ), typically forming row and column lines, respectively. The grounded source line 186 may be the bottom conductor layer 52 in FIG. 4, while the remaining conductor layers in each dot are isolated from the conductor layers in the other dots. Each MOSFET symbol shows a control gate and a floating gate.

A flash memory is a type of Electronically Erasable Programmable Read Only Memory (EEPROM) which can be programmed and erased in large blocks. The memory cells are typically arranged in a grid that has two transistors at each intersection or has a transistor with a stacked control gate and floating gate. Because the floating gate is electrically isolated by a dielectric layer, any electrons placed on it are trapped there. This behavior is what makes flash memory non-volatile. Electron tunneling through the dielectric layer is used to add or remove electrons to/from the floating gate. Flash memory works by adding (charging) or removing (uncharging) electrons to and from the floating gate. A bit's 0 or 1 state depends upon whether or not the floating gate is charged or uncharged. When electrons are present on the floating gate, current can't flow through the transistor and the bit state is 0. This is the normal state for a floating gate. When electrons are removed from the floating gate, current is allowed to flow and the bit state is 1.

Figure 27:
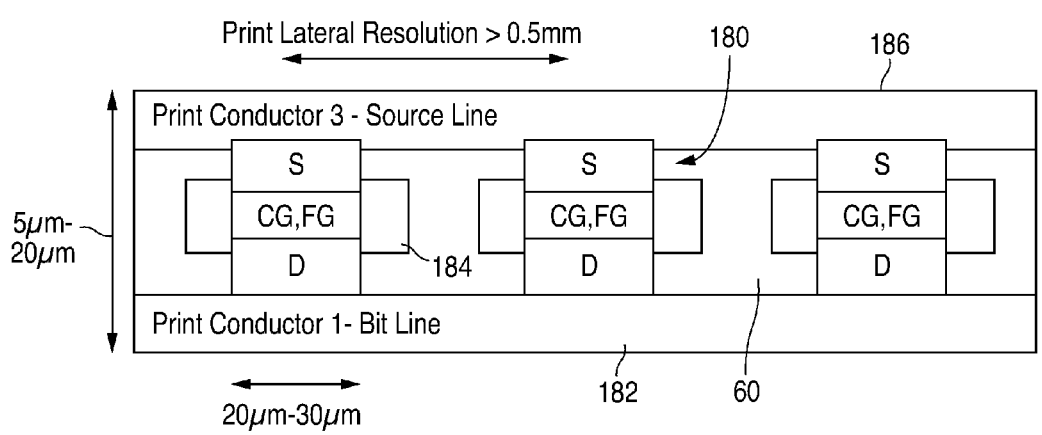
FIG. 27 depicts a cross-section of a portion of the printed circuit of FIG. 26, showing three levels of conductor layers for contacting the source, drain, and gate electrodes of the MOSFETs.

FIG. 27 is a cross-section of a portion of a NOR flash memory, where each of the floating gate MOSFET symbols in FIG. 26 is replaced with a single simplified vertical MOSFET 180, and where the depicted single MOSFET 180 in a memory cell is actually a plurality of printed MOSFETs in a group connected in parallel. The drain electrodes of the MOSFETs 180 are connected to the same conductor layer, which acts as the bit line 182. The source electrodes of the MOSFETs 180 are connected to the same conductor layer, which may be a source line 186. And the middle gate electrodes are connected to the middle conductor layer, which acts as a word line 184. A dielectric 60 insulates the conductor layers. The control gate CG and the floating gate FG are in a stacked configuration.

Figure 28:
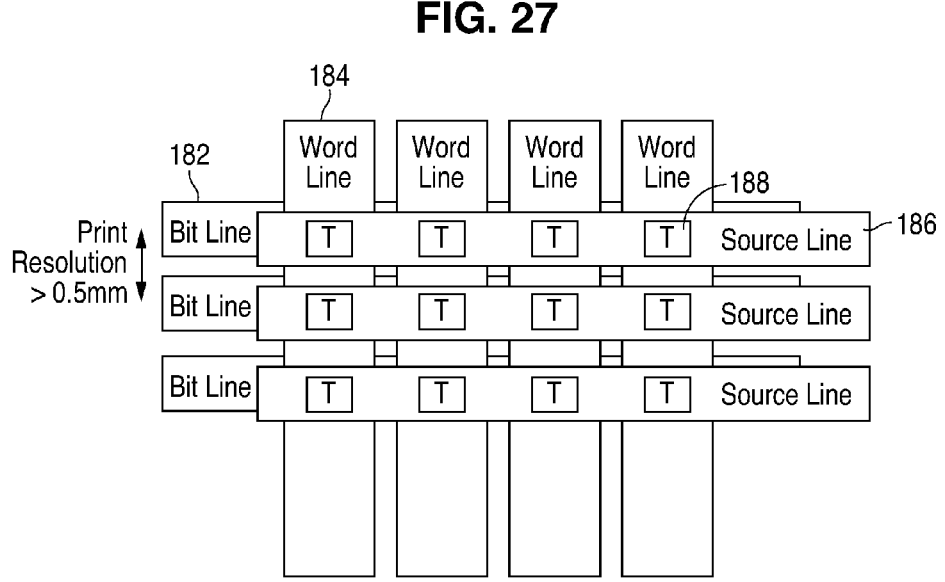
FIG. 28 is a top down view of the NOR flash memory array, showing the various address lines.

FIG. 28 is a top down view of the NOR memory showing the array of bit lines 182 and word lines 184 for addressing a MOSFET group at the intersection of a bit line and word line. The source electrodes of the MOSFETs are connected to the source lines 186 at the locations of the squares 188. The print resolution between adjacent conductor lines is slightly greater than 0.5 mm. Much smaller resolutions of the lines may be obtained using a mask for the lines.

Figure 29:
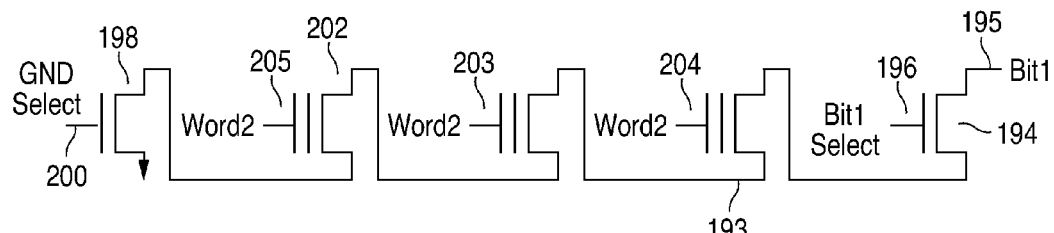
FIG. 29 is a schematic diagram of a row in a NAND flash memory array that may be printed using groups of MOSFETs connected in parallel (so each group represents a single MOSFET), where the groups are interconnected to form the circuit depicted in FIG. 29.

FIG. 29 illustrates a portion of a row in a NAND flash memory, using groups of printed floating gate MOSFETs. The MOSFETs are interconnected by printed series connect lines 193. A bit-select MOSFET 194 is connected to a bit line 195 and a bit select line 196. A ground select MOSFET 198 is connected to ground and a GND select line 200. The remaining MOSFETs 202-204 are connected to different word lines 205.

Figure 30:
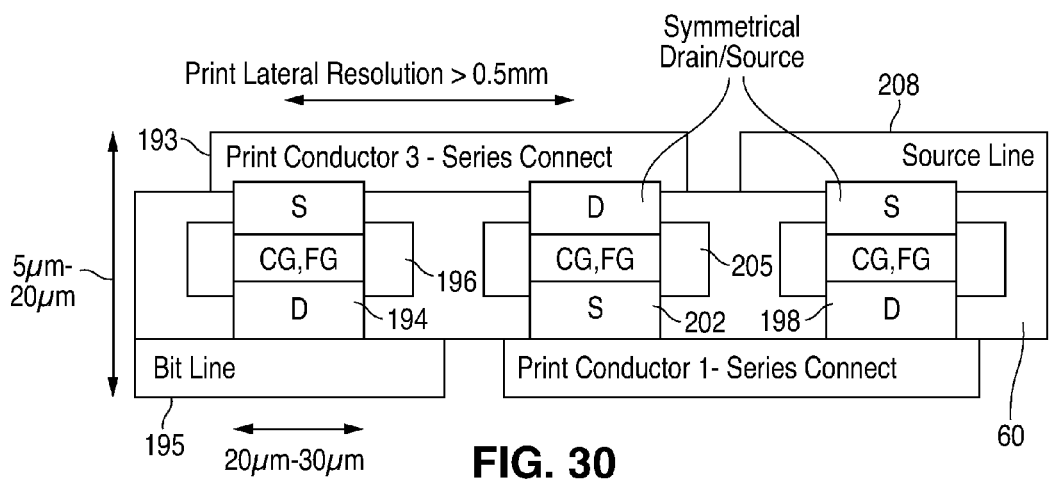
FIG. 30 depicts a cross-section of a portion of the printed circuit of FIG. 29, showing three levels of conductor layers for contacting the source, drain, and gate electrodes of the MOSFETs.

FIG. 30 is a cross-section of a portion of a row in the NAND memory, showing three vertical MOSFETs 194, 202, and 198 (the MOSFETs 203 and 204 are not shown for simplicity). Note that the MOSFET 202 is shown upside down as a result of the printing process but, since the MOSFETs are symmetrical, the orientations have no effect on the operation. The bit line 195 is shown along with the series connect lines 193 and source line 208 connected to ground. The middle conductors form the GND select line 200, the word lines 205, and the bit select line 196.

Figure 31:
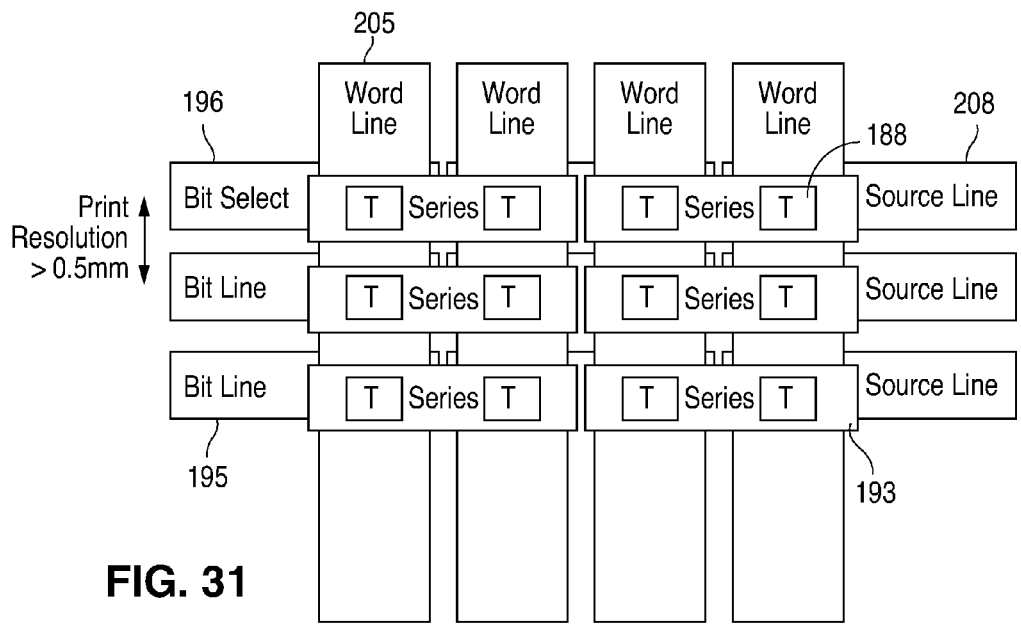
FIG. 31 is a top down view of the NAND flash memory array, showing the various address lines.

FIG. 31 is a top down view of the NAND memory showing the array of bit lines 195, bit select lines 196, word lines 205, source lines 208, and series connect lines 193 for addressing a MOSFET group at the intersection of a word line when the bit select and GND select signals are high for that MOSFET group. The source electrodes of the MOSFETs are connected to the source lines 208 at the locations of the squares 188. The GND select line 200 is not shown for simplicity.

Many other types of memories and logic circuits, such as latches, counters, etc., may be formed by the proper interconnections. The circuits may be conventional.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a circuit comprising:
   providing an ink containing a plurality of pre-formed, 3-terminal semiconductor electrical devices mixed in a solvent, thereby producing an ink,
   wherein the devices include a top electrode, a bottom electrode, and an intermediate electrode displaced vertically from the top electrode and bottom electrode;
   printing the ink over a first conductor layer and curing the ink to form a layer of the devices having the bottom electrode electrically connected to the first conductor layer;
   providing a second conductor layer to electrically contact the intermediate electrode; and
   providing a third conductor layer to electrically contact the top electrode,
   wherein the devices are electrically connected in parallel by a combination of the first conductor layer, the second conductor layer, and the third conductor layer.

2. The method of claim 1 further comprising depositing a first dielectric layer over the first conductor layer and depositing a second dielectric layer over the second conductor layer.

3. The method of claim 1 wherein the intermediate electrode is offset from a midway point on the devices between the top electrode and the bottom electrode.

4. The method of claim 1 wherein the devices have a largest dimension less than 200 microns.

5. The process of claim 1 further comprising applying electrical signals to the first conductor layer, the second conductor layer, and the third conductor layer to operate the devices in parallel.

6. The process of claim 1 wherein the devices are one of MOSFETs, JFETs, or bipolar transistors.

7. The process of claim 1 wherein the devices comprise vertical MOSFETs having a gate formed around a body region.

8. The process of claim 1 wherein the devices are printed in groups, wherein devices in a single group are connected in parallel by the first conductor layer, the second conductor layer, and the third conductor layer.

9. The process of claim 8 further comprising interconnecting the groups of devices to form circuits.

10. The process of claim 9 wherein the step of interconnecting the groups of devices to form circuits comprises interconnecting the groups of devices to form logic gates.

11. The process of claim 9 wherein the step of interconnecting the groups of devices to form circuits comprises interconnecting the groups of devices to form a memory having address lines.

12. The process of claim 1 wherein the first conductor layer is supported by a substrate.

13. The process of claim 12 wherein the substrate is flexible.

14. A circuit comprising:
    a substrate having a first conductor layer;
    a plurality of pre-formed, 3-terminal semiconductor electrical devices that have been mixed in a solution to form an ink and printed over the first conductor layer and cured, wherein the devices include a top electrode, a bottom electrode, and an intermediate electrode displaced vertically from the top electrode and bottom electrode, wherein the bottom electrode of the devices is electrically connected to the first conductor layer;
    a second conductor layer electrically contacting the intermediate electrode; and
    a third conductor layer to electrically contacting the top electrode,
    wherein the devices are electrically connected in parallel by a combination of the first conductor layer, the second conductor layer, and the third conductor layer.

15. The circuit of claim 14 wherein the devices are printed in groups, wherein devices in a single group are connected in parallel by the first conductor layer, the second conductor layer, and the third conductor layer.

16. The circuit of claim 15 wherein the groups have three leads extending from each group, wherein the leads are interconnectable to form circuits.

17. The circuit of claim 15 wherein the groups of devices are interconnected to form circuits.

18. The circuit of claim 14 wherein the devices have a largest dimension less than 200 microns.

19. The circuit of claim 14 wherein the devices are one of MOSFETs, JFETs, or bipolar transistors.

20. A printable MOSFET die comprising:
    a first semiconductor layer of a first conductivity type;
    a first electrode on a bottom surface of the first semiconductor layer;
    a body region of a second conductivity type formed over the first semiconductor layer;
    a second semiconductor layer of the first conductivity type formed over the body region;
    a second electrode formed over a top surface of the second semiconductor layer, the second electrode forming a raised bump over the second semiconductor layer, the second electrode forming a central top electrode for the MOSFET die;
    a dielectric formed over at least a portion of a sidewall of the second electrode;
    a trench through the second semiconductor layer and into the body region, the trench containing a conductive material forming a gate along an exposed side of the body region, wherein the gate surrounds a central portion of the second semiconductor layer; and a third electrode electrically contacting the gate, the third electrode being displaced vertically between a top surface of the second electrode and the first electrode to form an intermediate electrode, wherein the MOSFET die is configured for being infused in a printable ink, and wherein a largest dimension of the MOSFET is less than 200 microns.

21. The MOSFET die of claim 20 wherein the trench extends to an edge of the die.

22. The MOSFET die of claim 20 wherein a portion of the second semiconductor layer remains on opposite sides of the trench.

23. The MOSFET die of claim 20 wherein the body region is not electrically connected to the first semiconductor layer and the second semiconductor layer.

24. The MOSFET die of claim 20 wherein the die has a generally hexagonal shape.

25. The MOSFET die of claim 20 wherein the die is infused in a printable ink for being printed on a conductor layer.

* * * * *